(12) United States Patent
Khanna

(10) Patent No.: US 6,175,513 B1
(45) Date of Patent: Jan. 16, 2001

(54) METHOD AND APPARATUS FOR DETECTING MULTIPLE MATCHES IN A CONTENT ADDRESSABLE MEMORY

(75) Inventor: Sandeep Khanna, Santa Clara, CA (US)

(73) Assignee: NetLogic Microsystems, Mountain View, CA (US)

( * ) Notice: Under 35 U.S.C. 154(b), the term of this patent shall be extended for 0 days.

(21) Appl. No.: 09/351,962

(22) Filed: Jul. 12, 1999

(51) Int. Cl.$^7$ ................................................. G11C 15/00
(52) U.S. Cl. ............................................... 365/49; 711/108
(58) Field of Search ..................... 365/49, 189.07; 711/108

(56) References Cited

U.S. PATENT DOCUMENTS

| | | | |
|---|---|---|---|
| 5,426,602 | * 6/1995 | Luuoff | 365/49 |
| 5,446,686 | * 8/1995 | Bosngav et al. | 365/49 |
| 5,454,094 | 9/1995 | Montoye | 395/435 |
| 5,640,534 | * 6/1997 | Liv et al. | 711/108 |
| 5,852,569 | * 12/1998 | Srinivasan et al. | 365/49 |
| 5,893,931 | 4/1999 | Peng et al. | 711/206 |

OTHER PUBLICATIONS

Preliminary Data Sheet, GEC Plessey Semiconductors, Feb. 1997, pp. 1–15.

* cited by examiner

*Primary Examiner*—Tan T. Nguyen
(74) *Attorney, Agent, or Firm*—William L. Paradice, III

(57) ABSTRACT

A multiple match circuit generates a multiple match flag for an associated CAM array having n words by logically ORing k=log$_2$n intermediate multiple match flags. Each of the intermediate multiple match flags is generated in response to a unique logical combination of a plurality of match line signals corresponding to the n CAM words. For one embodiment, the first n/2 match line signals are logically ORed and the second n/2 match line signals are logically ORed. The resultant OR output signals are logically ANDed to generate a first intermediate multiple match flag. Then, the first n/4 match line signals and the second n/4 match line signals are each logically ORed together, and the resulting OR output signals are logically ANDed together to generate a first signal. The third n/4 match line signals and the fourth n/4 match line signals are combined in a similar manner to generate a second signal. These first and second signals are logically ORed to generate a second intermediate multiple match flag. Next, eight groups of n/8 match line signals are each logically ORed together to generate eight OR output signals. Sequential pairs of these eight OR output signals are logically ANDed together, and the resultant AND output signals are then logically ORed to generate a third intermediate multiple match flag. In the last or k=log$_2$n$^{th}$ iteration, pairs of the match line signals are logically ANDed to generate n/2 signals which, in turn, are logically ORed to generate the last intermediate multiple match flag.

35 Claims, 15 Drawing Sheets

METHOD AND APPARATUS FOR DETECTING MULTIPLE MATCHES IN A CONTENT ADDRESSABLE MEMORY

CROSS-REFERENCE TO RELATED APPLICATION

This application is related to the commonly owned U.S. patent application Ser. No. 09/351,545 entitled "METHOD OF GENERATING AN ALMOST FULL FLAG AND A FULL FLAG IN A CONTENT ADDRESSABLE MEMORY," filed on the same day as the present application.

BACKGROUND

1. Field of Invention

This invention relates generally to content addressable memories and specifically to multiple match conditions in a content addressable memory.

2. Description of Related Art

A content addressable memory (CAM) includes an array of memory cells arranged in a matrix of rows and columns. Each memory cell stores a single bit of digital information. The bits stored in a row of memory cells in the CAM array constitute a CAM word. During compare operations, a comparand word is received at appropriate input terminals of the CAM and then compared to all the CAM words. If the comparand word matches one of the CAM words, a match line corresponding to the matching CAM word is asserted to indicate a match condition. If the comparand word matches more than one of the CAM words, the match line corresponding to each of the matching CAM words is asserted, and a "multiple match" flag is also asserted to indicate the multiple match condition.

The multiple match flag is generated in response to a logical combination of the match line signals. The complexity of multiple match circuits that implement this logical combination increases approximately exponentially with increases in the number of CAM words. For example, where a CAM array has only two words, the multiple match flag is generated by simply ANDing the two corresponding match signals. Thus, for an array having 2 CAM words, the multiple match flag=m0*m1, where m0 and m1 are the first and second corresponding match line signals, respectively, and * indicates the logical AND function. Here, the multiple match circuit is typically implemented using a single 2-input AND gate. For 4 CAM words, the multiple match flag MMF=m0*m1+m0*m2+m0*m3+m1*m2+m1*m3+m2*m3, where + indicates the logical OR function. The corresponding multiple match circuit is typically implemented using six 2-input AND gates and one 6-input OR gate to provide the multiple match flag MMF. In a similar manner, for an array having 8 CAM words, the multiple match circuit is typically implemented using twenty-eight 2-input AND gates and a 28-input OR gate. Therefore, as shown in the above example, the size and complexity of the multiple match logic circuit is approximately exponentially related to the number of CAM words, as there is an AND gate for each possible combination of match line signals.

The rapid growth of the Internet has resulted in an explosion in the number of Internet Protocol (IP) addresses which, in turn, has necessitated the use of increasingly larger CAM arrays for IP address routing. Since the size and complexity of conventional multiple match circuits are approximately exponentially related to the number of CAM words, as described above, incremental increases in CAM array size typically result in approximately exponential increases in the size and complexity of the associated multiple match circuit. This exponential relationship between number of CAM words and size of the multiple match circuit can undesirably limit the cost-effectiveness of larger CAM array sizes desired for IP addressing.

SUMMARY

A multiple match circuit and structure are disclosed whose size and complexity are approximately logarithmically related to the number of CAM words. In accordance with one embodiment of the present invention, a multiple match flag circuit is configured to determine whether a multiple match condition exists during a compare operation within an n-word CAM array, and is also configured to generate a multiple match flag by logically ORing $k=\log_2 n$ intermediate multiple match flags. Each of the intermediate multiple match flags is generated in response to a unique logical combination of a plurality of match line signals corresponding to the n CAM words.

For one embodiment, the first n/2 match line signals are logically ORed and the second n/2 match line signals are logically ORed. The resultant OR output signals are logically ANDed to generate a first intermediate multiple match flag. Then, the first n/4 match line signals and the second n/4 match line signals are each logically ORed together, and the resulting OR output signals are logically ANDed together to generate a first signal. The third n/4 match line signals and the fourth n/4 match line signals are combined in a similar manner to generate a second signal. These first and second signals are logically ORed to generate a second intermediate multiple match flag. Next, eight groups of n/8 match line signals are each logically ORed together to generate eight OR output signals. Sequential pairs of these eight OR output signals are logically ANDed together, and the resultant AND output signals are then logically ORed to generate a third intermediate multiple match flag. This process continues for $k=\log_2 n$ iterations, where each iteration includes an associated match logic circuit. In the last or $k=\log_2 n^{th}$ iteration, pairs of the match line signals are logically ANDed to generate n/2 signals which, in turn, are logically ORed to generate the last intermediate multiple match flag.

In other embodiments, a plurality of the multiple match circuits disclosed herein can be cascaded together to generate a multiple match flag for larger CAM arrays. The approximately logarithmical relationship between the size and complexity of present multiple match circuits and the number of CAM words may allow for savings in silicon area which becomes increasingly significant with increasing CAM size. Further, the reduced circuit complexity may result in less parasitic capacitances and gate delays which, in turn, generally improves circuit performance.

BRIEF DESCRIPTION OF THE DRAWINGS

Like reference numerals refer to corresponding parts throughout the drawing figures.

DETAILED DESCRIPTION

Multiple match flag circuits in accordance with the present invention are configured so as to have a size and complexity that is approximately logarithmically related to the number of CAM words n. Here, the n match line signals resulting from a compare operation of an associated n-word CAM array are logically combined in each of $k=\log_2 n$ match logic circuits. Each match logic circuit generates a corresponding intermediate multiple match flag using a unique logical combination of the match line signals. The intermediate multiple match flags are logically ORed to generate a multiple match flag indicative of whether a multiple match condition exists in response to the CAM compare operation.

Figure 1:
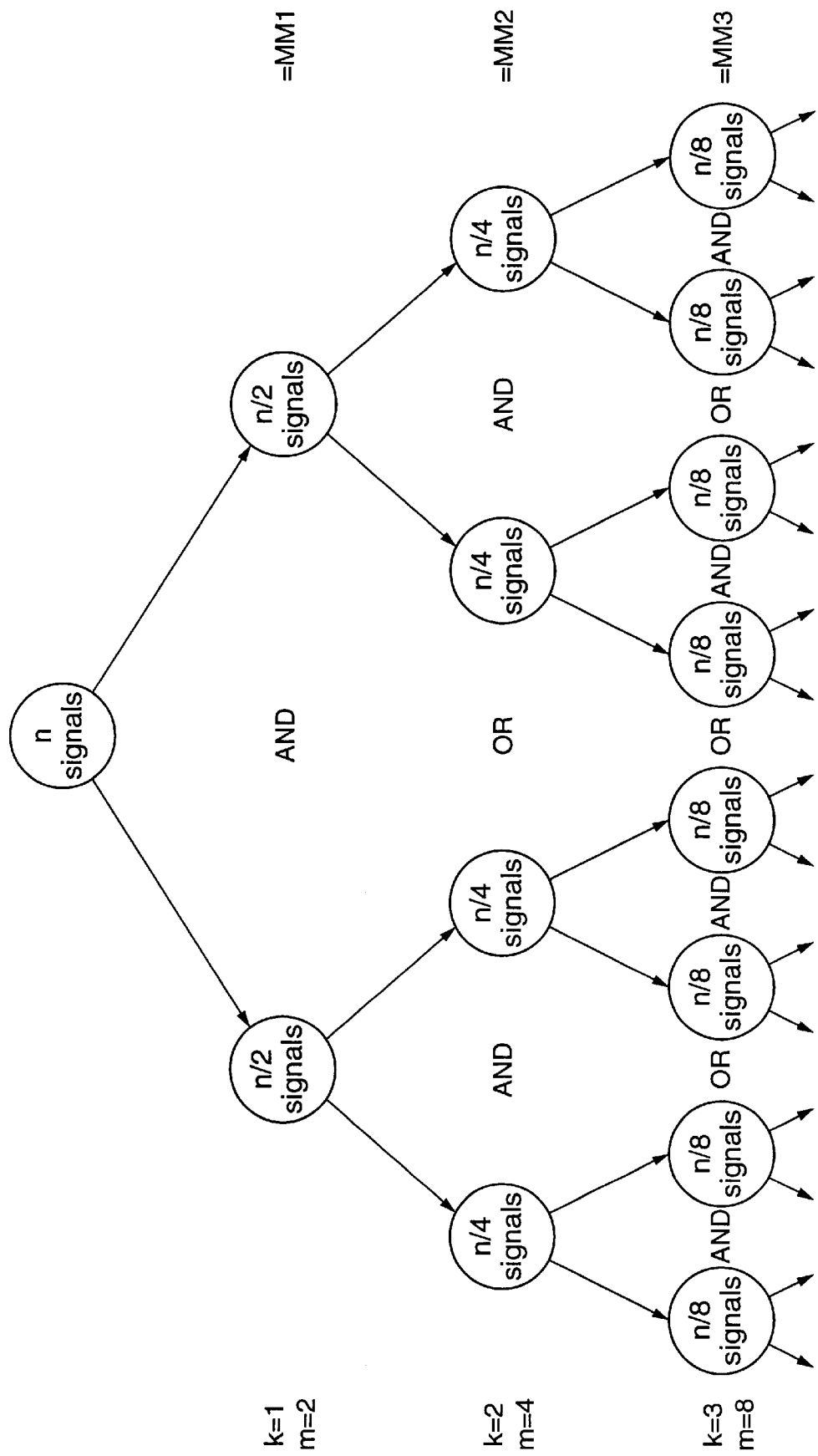
FIG. 1 is a logic flow diagram illustrating generation of a multiple match flag in accordance with the present invention.

Present embodiments search for multiple matches in an iterative fashion, where each of the $k=\log_2 n$ iterations is implemented by a corresponding match logic circuit. Referring now to FIG. 1, each of the $k=\log_2 n$ iterations or match logic circuits divides the n match line signals into m groups of n/m match line signals, where $m=2^k$. In each iteration, each of the groups of match line signals defined in a previous iteration is divided into halves, and the corresponding intermediate multiple match flag is asserted if, for any of the groups defined by the previous iteration, there is at least one match condition within both of the halves defined in the present iteration. Thus, the first (k=1, m=2) iteration or match logic circuit divides the n match line signals into 2 groups of n/2 match line signals, and asserts the first intermediate multiple match flag MM1 if there is at least one match condition within both groups of n/2 match line signals. The second (k=2, m=4) iteration or match logic circuit halves each of the two groups of n/2 match line signals to form 4 groups of n/4 match line signals, and the second intermediate multiple match flag MM2 is asserted if there is a multiple match within either the first n/4 and the second n/4 match line signals or the third n/4 and fourth n/4 match line signals. The final or $k^{th}$ iteration defines n/2 pairs of match line signals, and asserts the final intermediate multiple match flag MMk if both match line signals of any of the n/2 pairs are asserted.

In other words, for one embodiment, the first n/2 match line signals are logically ORed and the second n/2 match line signals are logically ORed. The resultant OR output signals are logically ANDed to generate a first intermediate multiple match flag MM1. Then, the first n/4 match line signals and the second n/4 match line signals are each logically ORed together, and the resulting OR output signals are logically ANDed together to generate a first signal. The third n/4 match line signals and the fourth n/4 match line signals are combined in a similar manner to generate a second signal. These first and second signals are logically ORed to generate a second intermediate multiple match flag MM2. Next, eight groups of n/8 match line signals are each logically ORed together to generate eight OR output signals. Sequential pairs of these eight OR output signals are logically ANDed together, and the resultant AND output signals are then logically ORed to generate a third intermediate multiple match flag MM3. Although not specifically shown in FIG. 1, this process continues for $k=\log_2 n$ iterations, where each iteration is implemented using an associated match logic circuit. In the last or $k=\log_2 n^{th}$ iteration, pairs of the match line signals are logically ANDed to generate n/2 signals which, in turn, are logically ORed to generate the last intermediate multiple match flag. The intermediate multiple match flags are then logically ORed to generate the multiple match flag MMF.

Figure 2:
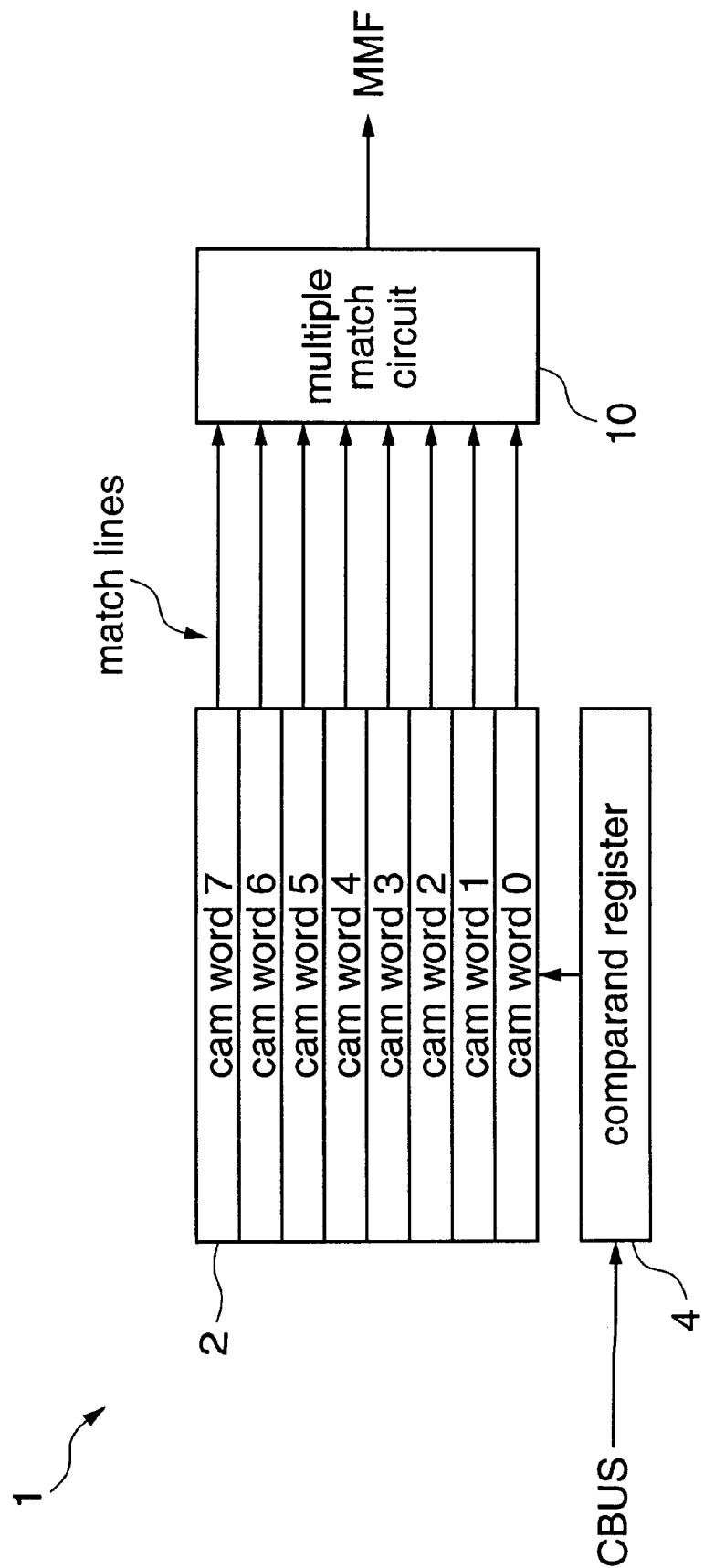
FIG. 2 is a block diagram of a CAM structure having an 8-input multiple match circuit in accordance with one embodiment of the present invention.

For example, FIG. 2 shows a CAM structure 1 including an 8-word CAM array 2, a comparand register 4, and a multiple match circuit 10 configured in accordance with the present invention to receive 8 match line signals from the CAM array 2. During a compare operation, a comparand word such as, for instance, an IP destination address, is received on a comparand bus CBUS and thereafter provided to the comparand register 4. The match line signals corresponding to those CAM words that match the comparand word are asserted. In response thereto, the multiple match circuit 10 determines whether more than one of the match line signals are asserted and, if so, asserts the multiple match MMF.

Figure 3:
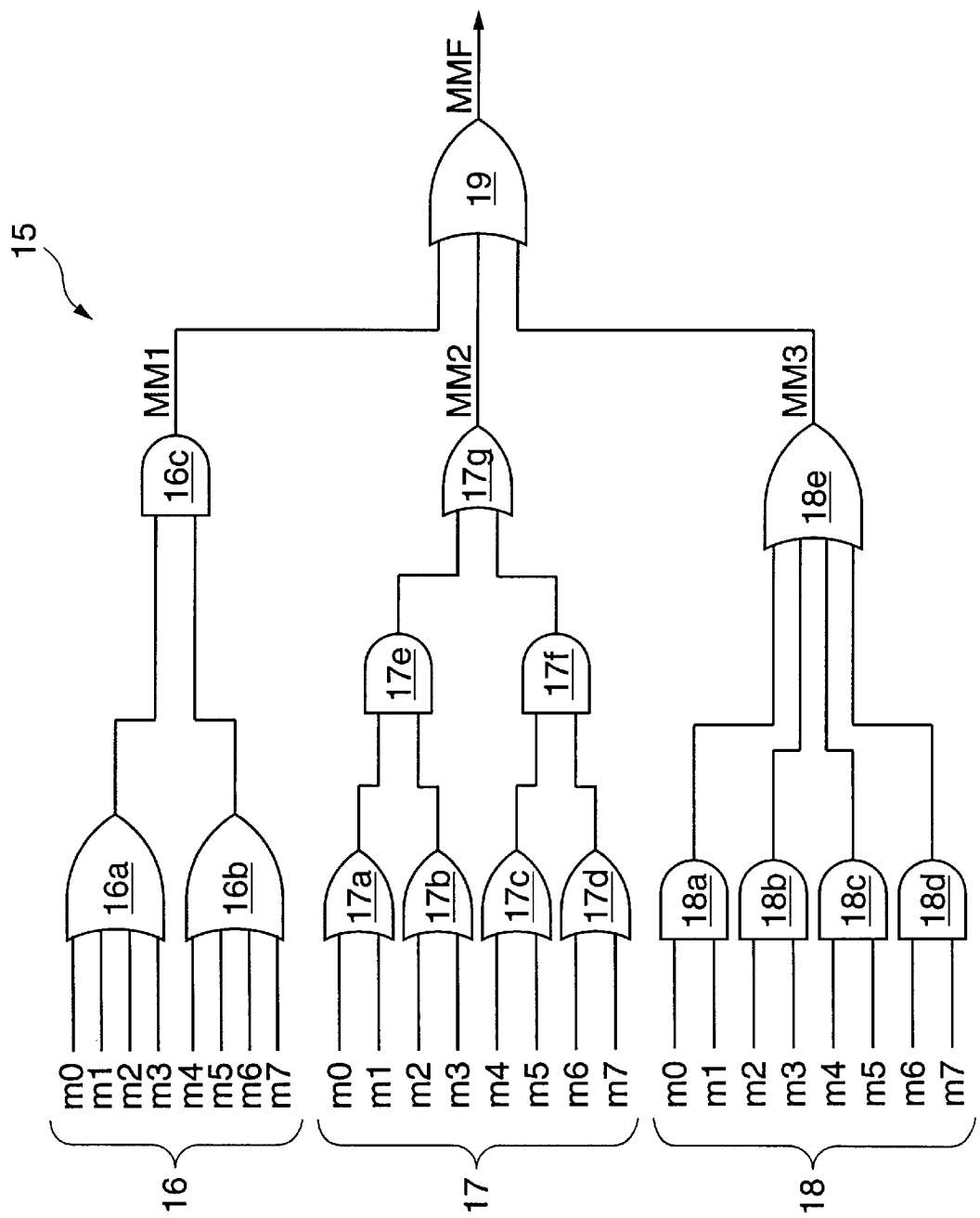
FIG. 3 is a logic diagram of the multiple match circuit of FIG. 2 in accordance with one embodiment of the present invention.

FIG. 3 illustrates logic 15 implemented within the multiple match circuit 10 of FIG. 2 in accordance with one embodiment of the present invention. Here, since the CAM array 2 has n=8 CAM words, the multiple match logic 15 includes $k=\log_2 8=3$ iterations or match logic circuits 16, 17, and 18. The first match logic circuit 16 corresponds with the first iteration (k=1) and generates the first intermediate multiple match flag MM1, the second match logic circuit 17 corresponds with the second iteration (k=2) and generates the second intermediate multiple match flag MM2, and the third match logic circuit 18 corresponds with the third iteration (k=3) and generates the third intermediate multiple match flag MM3. The multiple match flag MMF represents a logical OR combination of the first, second, and third intermediate multiple match flags MM1, MM2, and MM3, respectively.

Referring also to FIG. 1, in the first iteration (k=1, m=2), the 8 match line signals are divided into m=2 groups of n/m=4 signals. The 2 groups of match line signals m0–m3 and m4–m7 are provided to two 4-input OR gates 16a and 16b, respectively. The output signals provided by respective OR gates 16a and 16b are logically ANDed in one 2-input AND gate 16c to generate the first intermediate multiple match flag MM1. Here, the first intermediate multiple match flag MM1 may be expressed by the logical equation MM1= (m0+m1+m2+m3)*(m4+m5+m6+m7), where "+" indicates a logical OR operation and "*" indicates a logical AND operation. Thus, the first intermediate multiple match flag MM1 is asserted if at least one of the match lines m0–m3 is asserted and at least one of the match lines m4–m7 is asserted.

In the second iteration (k=2, m=4), each of the 2 groups of 4 match line signals defined in the first iteration are halved to provide m=4 groups of n/m=2 match line signals. The four pairs of match line signals m0–m1, m2–m3, m4–m5, and m6–m7 are provided to four 2-input OR gates 17a–17d, respectively. Pairs of the resultant OR output signals provided by respective OR gates 17a–17d are combined in corresponding AND gates 17e and 17f, as shown in FIG. 3. The resultant AND output signals provided by the AND gates 17e and 17f are logically ORed in a 2-input OR gate 17g to generate the second intermediate multiple match flag MM2. Here, the second intermediate multiple match flag MM2 may be expressed by the logical equation MM2=(m0+m1)*(m2+m3)+(m4+m5)*(m6+m7), and is therefore asserted if there is a match condition from match line signal pair m0–m1 and a match condition from match line signal pair m2–m3, or if there is a match condition from match line signal pair m4–m5 and a match condition from match line signal pair m6–m7.

In the third iteration (k=3, m=8), each of the 4 groups of 2 match line signals defined in the second iteration are halved to provide m=8 groups of n/m=1 match line signal. Pairs of the 8 match line signals m0–m7 are combined in four corresponding 2-input AND gates 18a–18d, respectively, as shown in FIG. 3. The resultant AND output signals provided by respective AND gates 18a–18d are logically ORed in a 4-input OR gate 18e to generate the third intermediate multiple match flag MM3. Here, the third intermediate multiple match flag MM3 is generated according to the logic equation MM3=m0*m1+m2*m3+m4*m5+m6*m7, and is thus asserted if both the match line signals of any of the pairs m0–m1, m2–m3, m4–m5, or m6–m7 are asserted.

Figure 4:
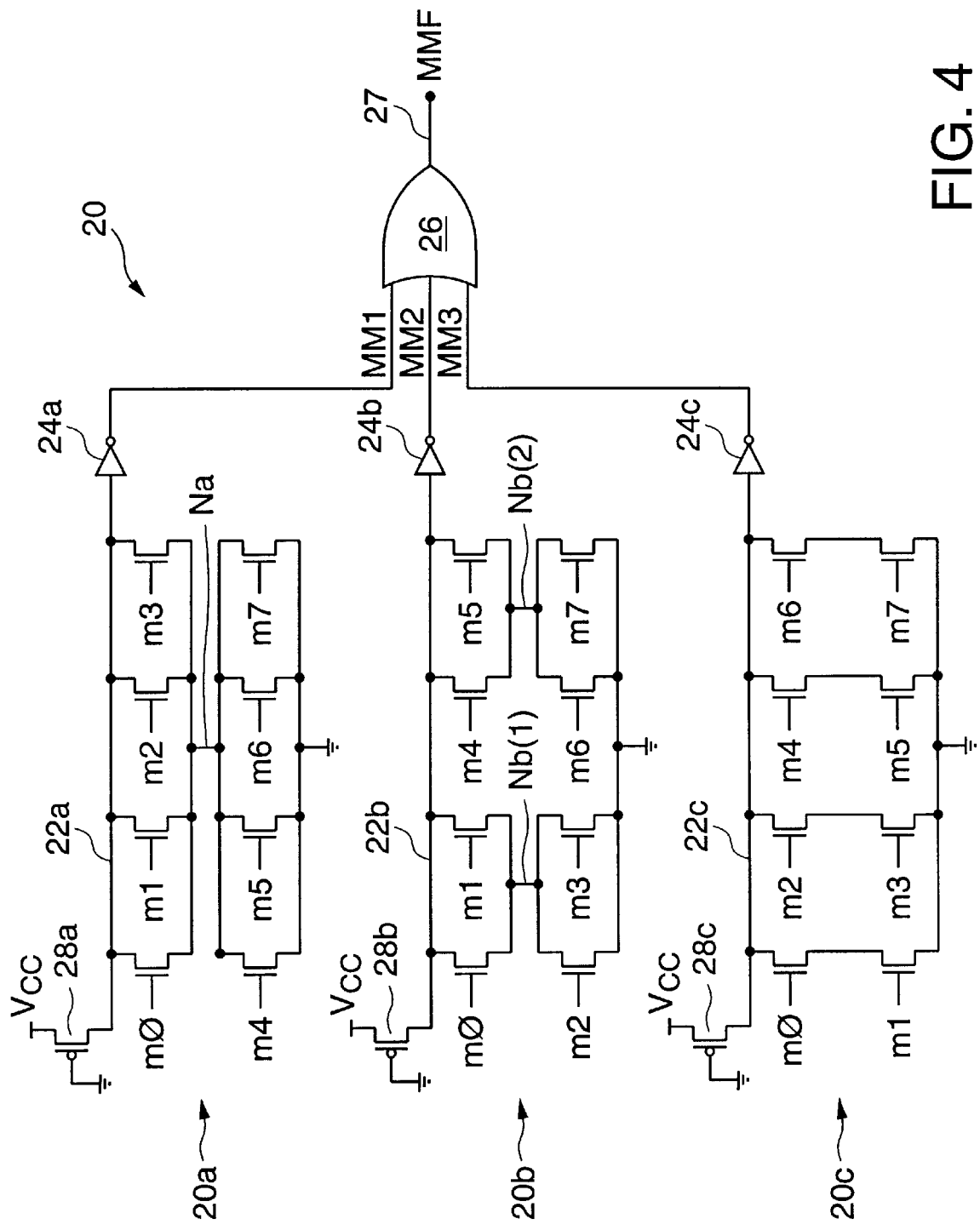
FIG. 4 is a schematic diagram of the multiple match circuit of FIG. 3 in accordance with one embodiment of the present invention.

FIG. 4. shows a multiple match circuit 20 that is one embodiment of the multiple match logic 15 of FIG. 3, where the multiple match circuit 20 of FIG. 4 includes 3 match logic circuits 20a, 20b, and 20c which correspond to match logic 16, 17, and 18, of FIG. 3, respectively. The eight match line signals m0–m7 received from the CAM array 2 (see also FIG. 2) are provided to the gates of corresponding MOS transistors within each of the match logic circuit 20a–20c, as shown in FIG. 4. In response to the eight match line signals m0–m7, the match logic circuits 20a–20c provide respective intermediate multiple match flags MM1, MM2, and MM3 on respective lines 22a, 22b, and 22c. A 3-input OR gate 26 is coupled to receive the intermediate multiple match flags MM1, MM2, and MM3 on respective lines 22a–22c and, in response thereto, generates the multiple match flag MMF on an output line 27. In this embodiment, the lines 22a–22c are pre-charged to a voltage supply $V_{CC}$ via respective pull-up transistors 28a–28c. Here, each of the match logic circuits 20a–20c includes n+1 transistors: one pull-down transistor for each of the n match line signals, and one pull-up transistor for pre-charging respective lines 22a–22c.

The first match logic circuit 20a includes four transistors configured to receive the first four match line signals m0–m3, each coupled in parallel between the line 22a and a node Na, and includes four transistors configured to receive the second four match line signals m4–m7, each coupled in parallel between the node Na and ground potential. Here, if any of match line signals m0–m3 are asserted and any of match lines signals m4–m7 are asserted, the signal line 22a is pulled to grounded potential, thereby asserting the first intermediate multiple match flag MM1 via inverter 24a. The MOS transistors within the second match logic circuit 20b, also coupled to receive respective match line signals m0–m7, are configured to generate the second match logic signal MM2=(m0+m1)*(m2+m3)+(m4+m5)*(m6+m7) via inverter 24b, as shown in FIG. 4. The MOS transistors within the third match logic circuit 20c are configured to generate the third match logic signal MM3= m0*m1+m2*m3+m4*m5+m6*m7 in a corresponding manner via inverter 24c, as shown in FIG. 4. Here, if any of the intermediate multiple match flags MM1–MM3 are asserted, the OR gate 26 asserts the multiple match flag MMF by, for instance, driving its output line 28 to a logic high state, e.g., $V_{CC}$.

As described above, k=$\log_2$n match logic circuits generate the multiple match flag MMF, where n equals the number of CAM words. Therefore, since each match logic block 20a–20c includes n+1 transistors to implement its corresponding logic function, the size and complexity of multiple match circuits in accordance with the present invention are approximately logarithmically related to the number of CAM words. This is in contrast to conventional multiple match circuits whose size and complexity are typically exponentially related to the number of CAM words. Here, the approximately logarithmical relationship between the size and complexity of present multiple match circuits and the number of CAM words may reduce the silicon area used to implement the multiple match circuit. This reduction in silicon area can become increasingly significant with increasing CAM size. Further, the resultant decrease in circuit complexity allowed by present embodiments may reduce parasitic capacitances and gate delays which, in turn, result in increased speed. In addition, the reduction in circuit complexity generally results in fewer manufacturing defects.

Figure 5:
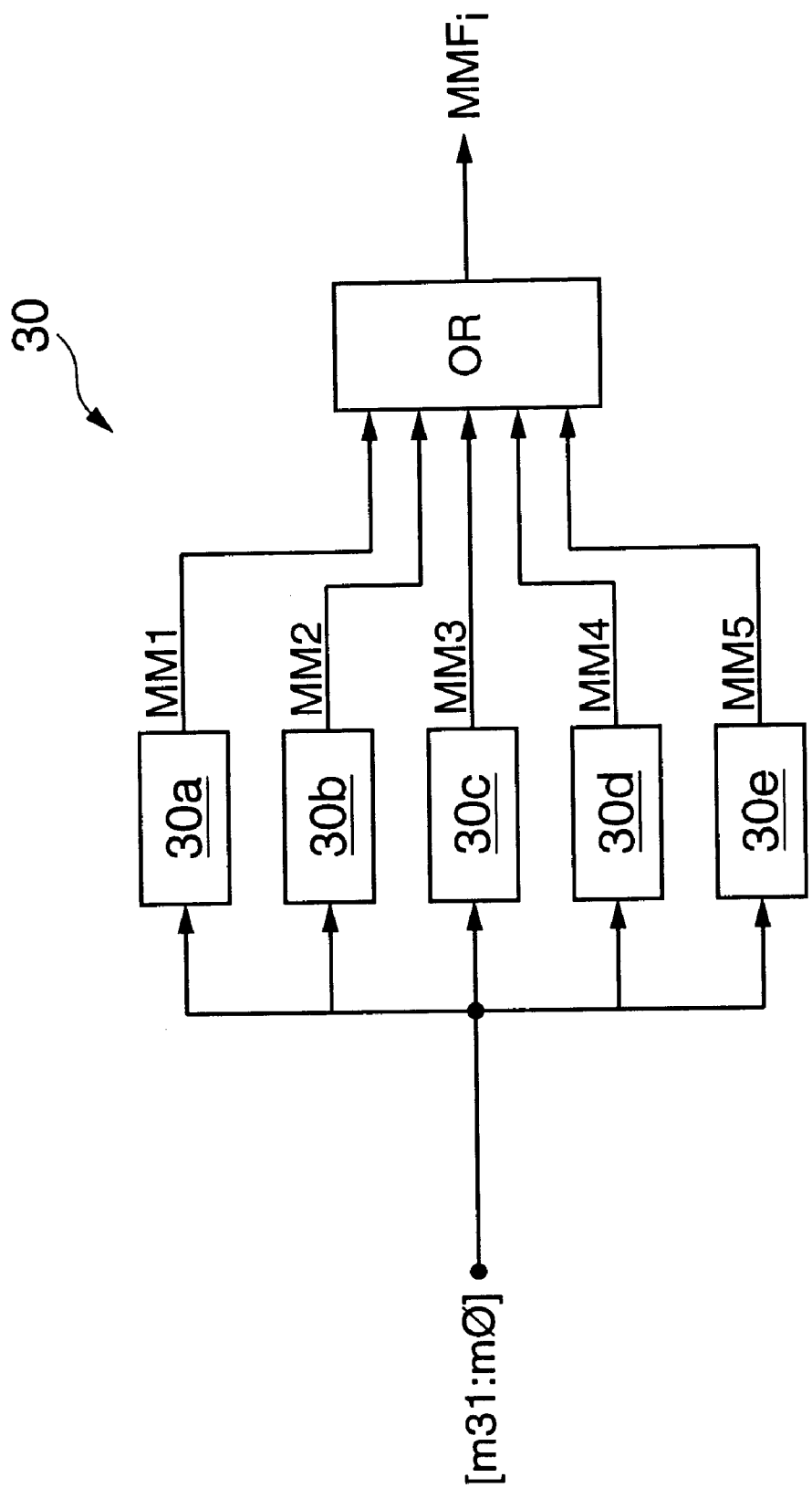
FIG. 5 is a block diagram of a 32-input multiple match circuit in accordance with another embodiment of the present invention.

Multiple match circuits in accordance with the present invention are easily adaptable to generate a multiple match flag for larger CAM arrays. For example, as shown in FIG. 5, a group of 32 match line signals m0–m31 provided by an associated CAM array (not shown for simplicity) during a compare operation may be processed in the manner described above to generate k=$\log_2$32=5 associated intermediate multiple match flags. The 5 intermediate multiple match flags MM1–MM5 are generated according to unique logical combinations of the 32 match line signals m0–m31 using respective match logic circuits 30a–30e, and then logically ORed in a 5-input OR gate to generate a multiple match flag MMF for the 32 match line signals m0–m31.

Figure 6A:
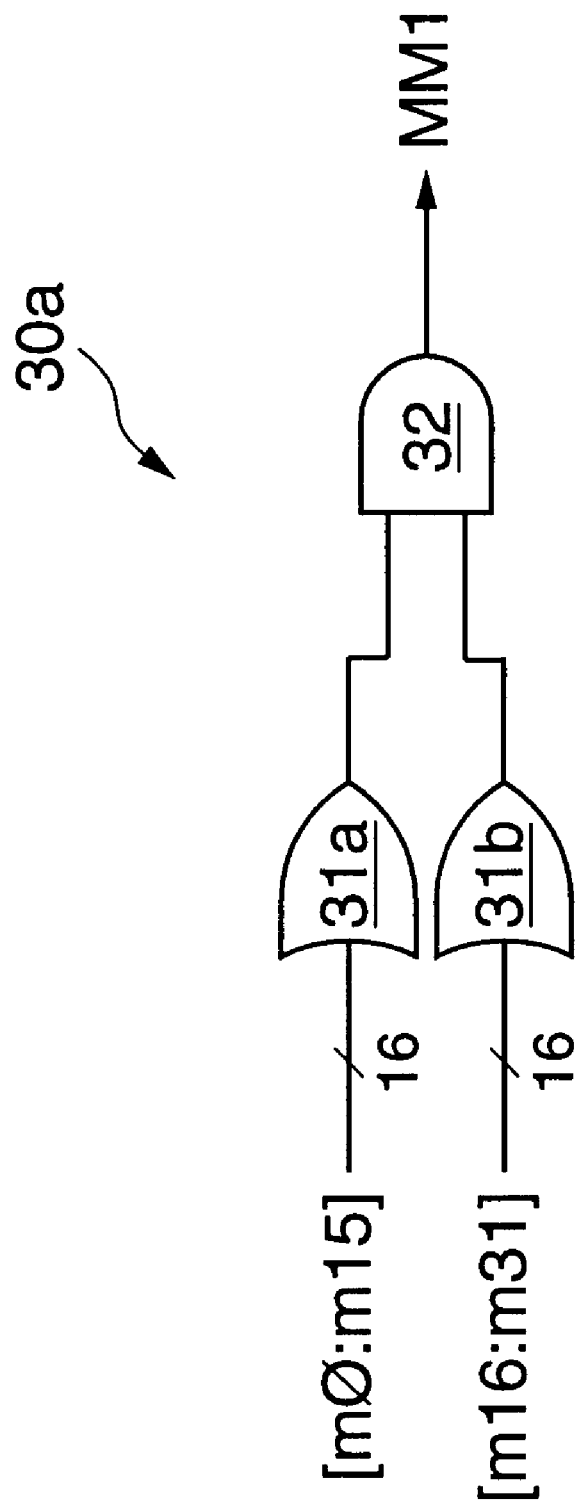
FIGS. 6a–6e are exemplary embodiments of logic diagrams of the match logic circuits implemented within the multiple match circuit of FIG. 5.

FIG. 6A illustrates logic implemented within the match logic circuit 30a of FIG. 5 in accordance with one embodiment of the present invention. Here, in the first iteration (k=1, m=2), the 32 match line signals are divided into m=2 groups of n/m=16 signals. The 2 groups of match line signals m0–m15 and m16–m31 are provided to two 16-input OR gates 31a and 31b, respectively. The output signals provided by respective OR gates 31a and 31b are coupled to one 2-input AND gate 32 which, in response thereto, generates the first intermediate multiple match flag MM1.

Figure 6B:
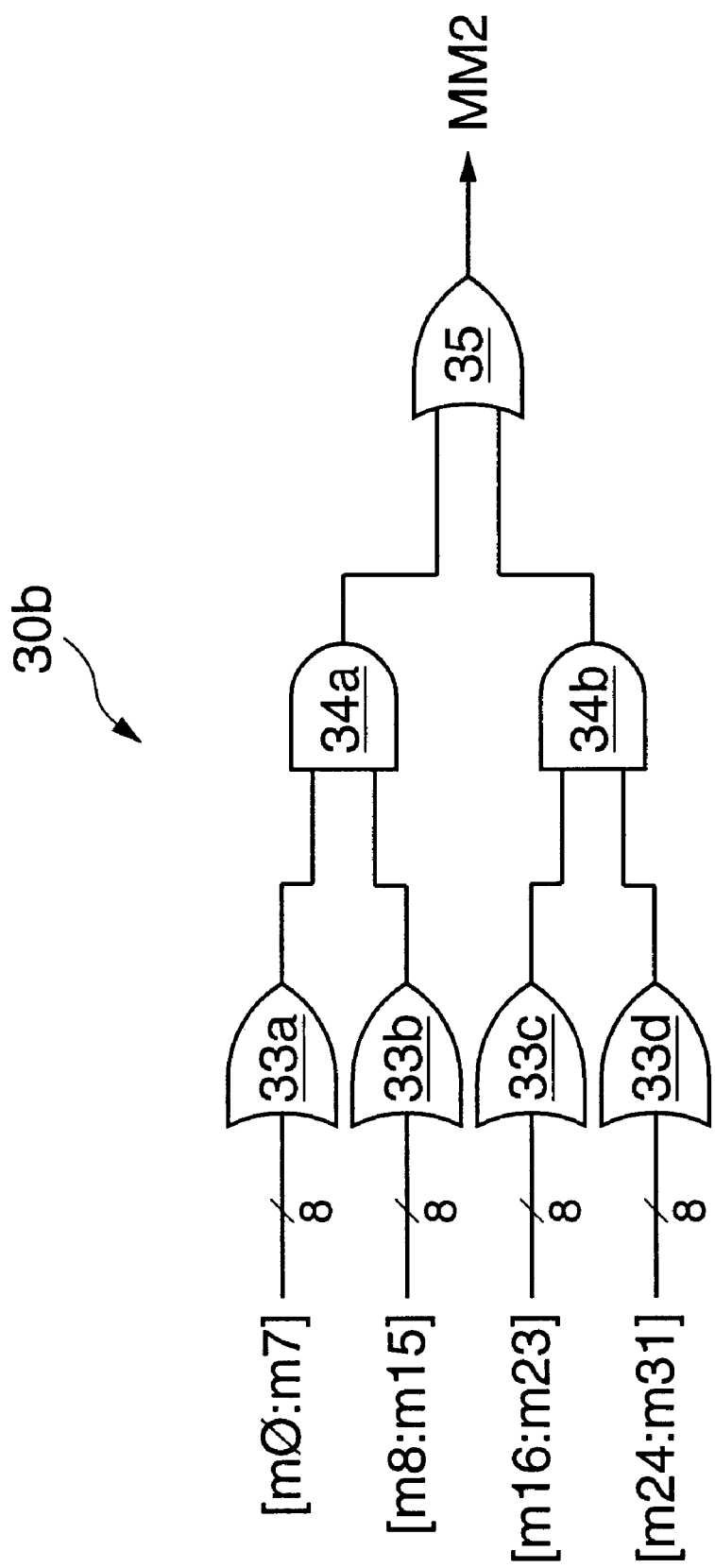

FIG. 6B illustrates logic implemented within the match logic circuit 30b of FIG. 5 in accordance with one embodiment of the present invention. Here, in the second iteration (k=2, m=4), each of the 2 groups of 16 match line signals defined in the first iteration of FIG. 6A are halved to provide m=4 groups of n/m=8 match line signals. The 4 groups of 8 match line signals are provided to four 8-input OR gates 33a–33d, respectively, as shown in FIG. 6B. The resultant OR output signals provided by respective OR gates 33a and 33b in response to match line signals m0–m7 and m8–m15, respectively, are provided to a 2-input AND gate 34a. In a similar manner, the resultant OR output signals provided by respective OR gates 33c and 33d in response to match line signals m16–m23 and m24–m31, respectively, are provided to a 2-input AND gate 34b. The resultant AND signals provided by AND gates 34a and 34b are logically ORed in a 2-input OR gate 35 to generate the second intermediate multiple match flag MM2.

Figure 6C:
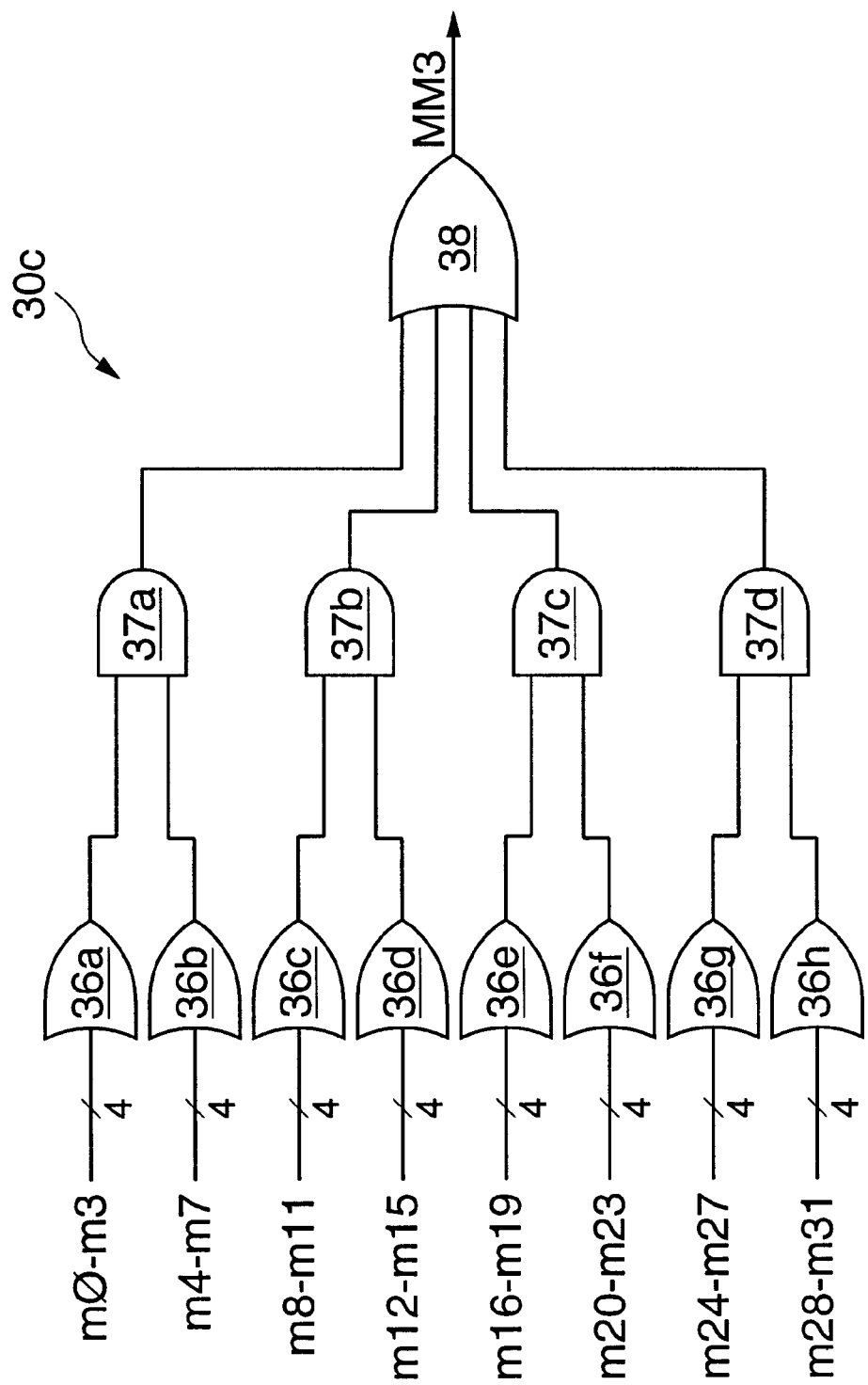

FIG. 6C illustrates logic implemented within the match logic circuit 30c of FIG. 5 in accordance with one embodiment of the present invention. Here, in the third iteration (k=3, m=8), each of the 4 groups of 8 match line signals defined in the second iteration of FIG. 6B are halved to provide m=8 groups of n/m=4 match line signals. The 8 groups of 4 match line signals are provided to eight 4-input OR gates 36a–36h, respectively, as shown in FIG. 6C. The resultant OR output signals provided by the 4 pairs of OR gates 36a–36b, 36c–36d, 36e–36f, and 36g–36h are provided to four 2-input AND gates 37a–37d, respectively. The resultant AND signals provided by AND gates 37a–37d are logically ORed in a 4-input OR gate 38 to generate the third intermediate multiple match flag MM3.

Figure 6D:
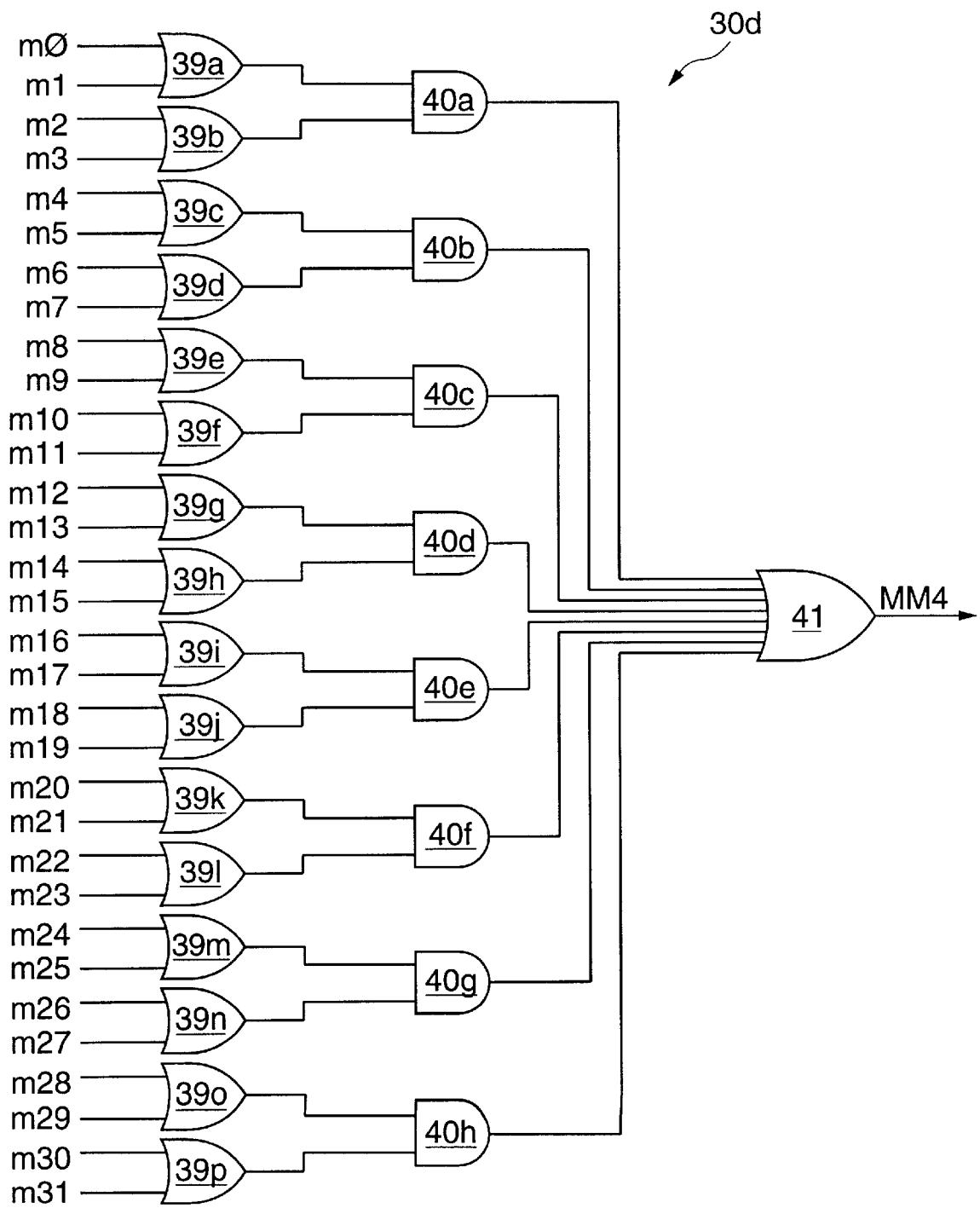

FIG. 6D illustrates logic implemented within the match logic circuit 30d of FIG. 5 in accordance with one embodiment of the present invention. Here, in the fourth iteration (k=4, m=16), each of the 8 groups of 4 match line signals defined in the third iteration of FIG. 6C are halved to provide m=16 groups of n/m=2 match line signals. The 16 pairs of match line signals are provided to sixteen 2-input OR gates 39a–39p, respectively, as shown in FIG. 6D. The resultant OR output signals provided by the 8 pairs of OR gates 39a–36b, 39c–39d, 39e–39f, 39g–39h, 39i–36j, 39k–39l, 39m–39n, and 39o–39p are provided to eight 2-input AND gates 40a–40h, respectively. The resultant AND signals provided by AND gates 40a–40h are logically ORed in an 8-input OR gate 41 to generate the fourth intermediate multiple match flag MM4.

Figure 6E:
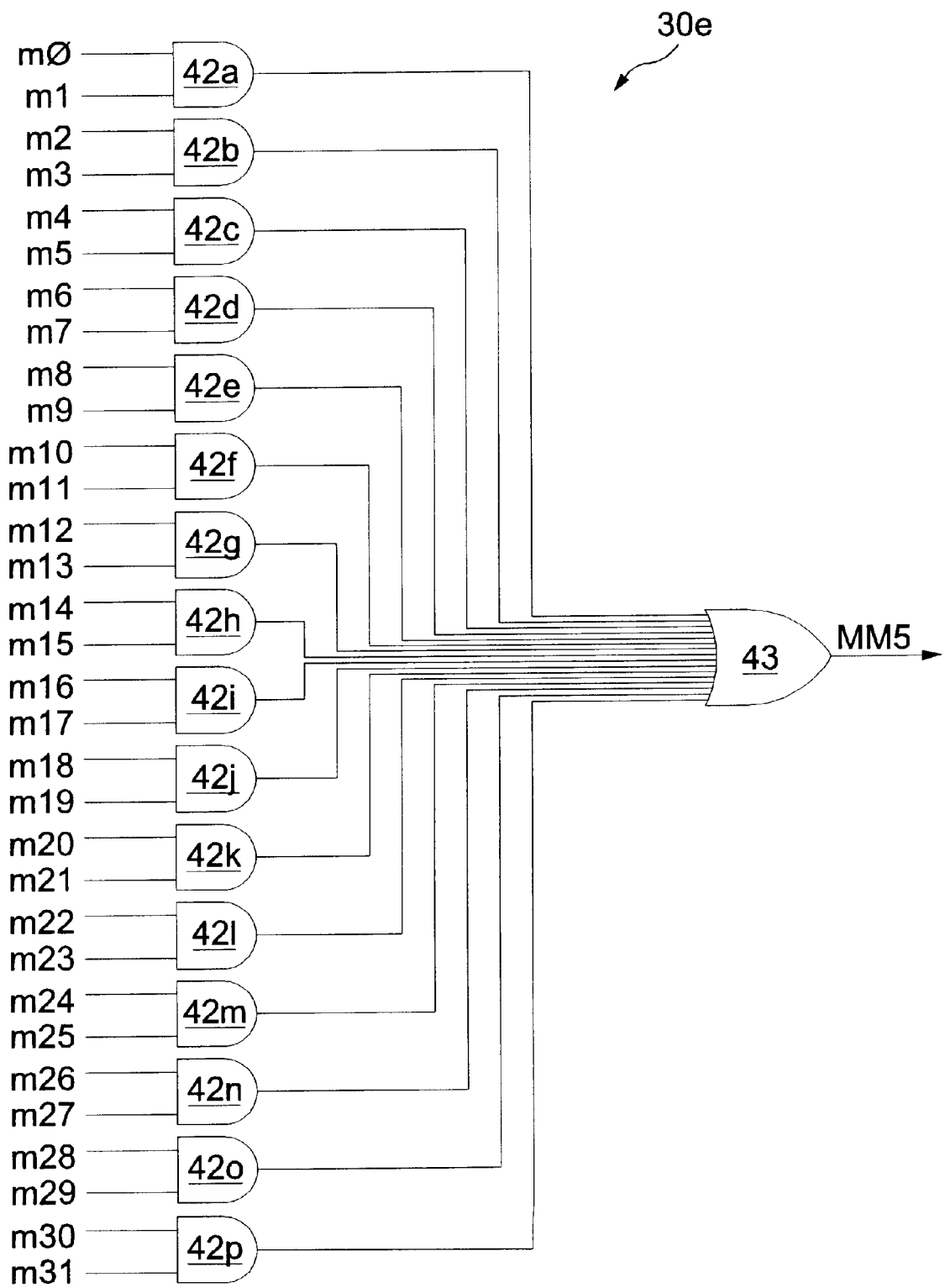

FIG. 6E illustrates logic implemented within the match logic circuit 30e of FIG. 5 in accordance with one embodiment of the present invention. Here, in the fifth iteration (k=5, m=32), each of the 16 groups of 2 match line signals defined in the fourth iteration of FIG. 6D are halved to provide m=32 groups of n/m=1 match line signal. The 32 match line signals m0–m31 are provided in pairs to sixteen 2-input AND gates 42a–42p, respectively, as shown in FIG. 6E. The resultant AND output signals provided by the 16 AND gates 42a–42p are logically ORed in a 16-input OR gate to generate the fifth intermediate multiple match flag MM5.

In some embodiments, each of the logic circuits 30a–30e shown in FIG. 5 and described with respect to FIGS. 6A–6E are implemented using MOS transistor gates configured in a manner similar to that shown in FIG. 4.

Figure 7:
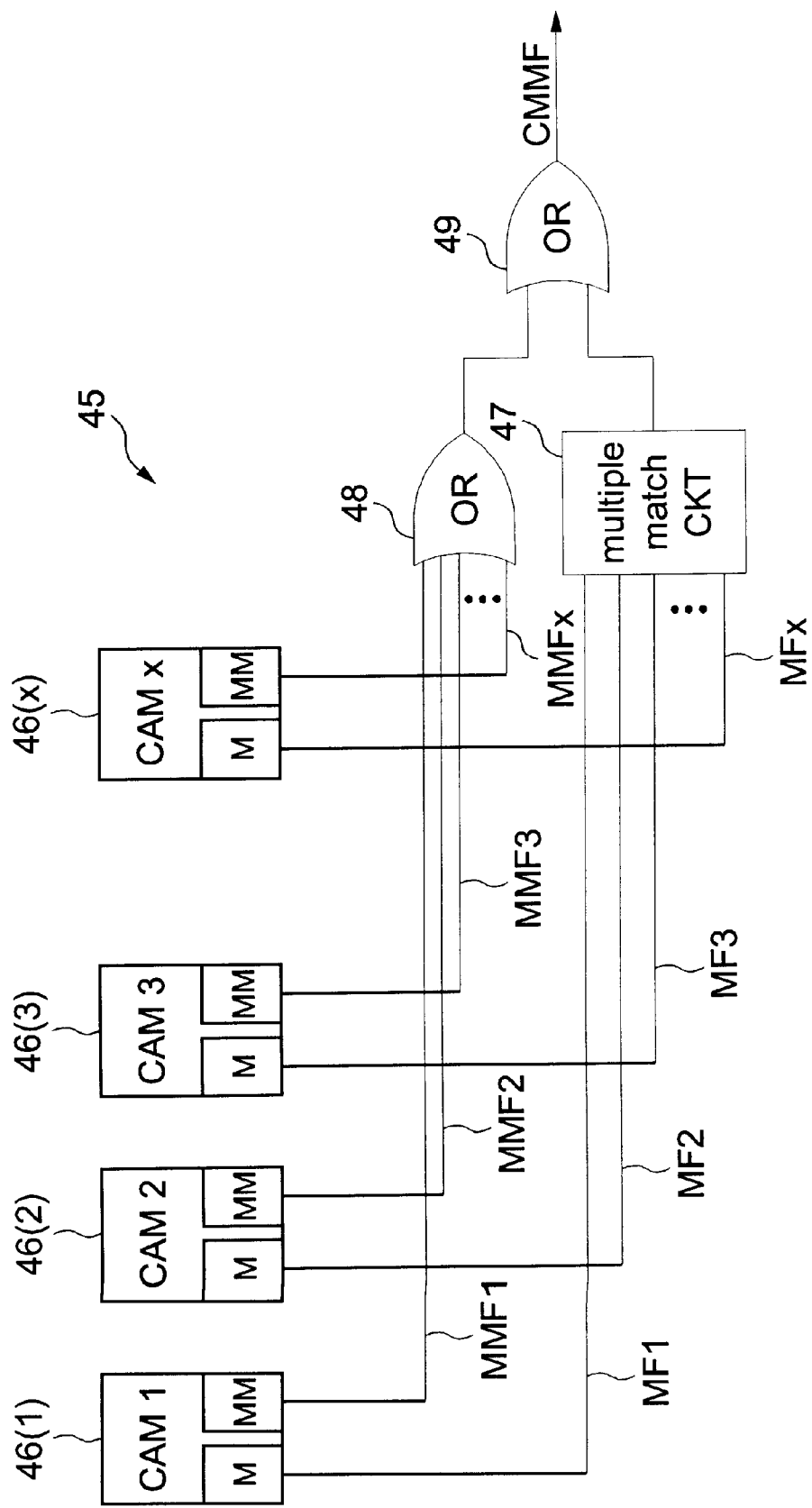
FIG. 7 is a block diagram of a multiple match structure configured in accordance with one of embodiment of the present invention to generate a multiple match flag for a plurality of CAM blocks.

In accordance with other embodiments of the present invention, a plurality of the multiple match circuits disclosed herein can be arranged to generate the multiple match flag for large CAM arrays having multiple CAM blocks. Referring to FIG. 7, a multiple match structure 45 in accordance with one embodiment of the present invention generates a composite multiple match flag CMMF for a plurality of CAM blocks 46(1)–46(x). Each of the CAM blocks 46(1)–46(x) includes an associated match circuit M that asserts an associated match flag MF if there is at least one match condition within that CAM, and also includes an associated multiple match circuit MM that asserts an associated multiple match flag MMF if there are two or more match conditions within that CAM. In one embodiment, the multiple match circuit within each of the CAM blocks 46(1)–46(x)is of the type described above in accordance with present embodiments. In some embodiments, the match circuit and multiple match circuits can be external to the CAM blocks.

The match flags MF1–MMFx corresponding to the CAM blocks 46(1)–46(x), respectively, are provided to an x-input multiple match circuit 47 which, in one embodiment, is of the type described above in accordance with present embodiments. The multiple match flags MMF1–MMFx corresponding to the CAM blocks 46(1)–46(x) are provided to an x-input OR gate 48. The first and second intermediate multiple match flags provided by the multiple match circuit 47 and the OR gate 48, respectively, are logically ORed in a 2-input OR gate 49 to generate the composite multiple match flag CMMF. Thus, if there is a multiple match condition within any of the CAM blocks 46(1)–46(x), as indicated by multiple match flags MMF1–MMFx, respectively, the OR gate 48 asserts the composite multiple match flag CMMF via the OR gate 49. Further, if there is a match condition in more than one of the CAM blocks 46(1)–46(x), as indicated by match flags MF1–MFx, respectively, the multiple match circuit 47 asserts the composite multiple match flag CMMF via the OR gate 49. Here, implementation of the composite multiple match flag CMMF can be expressed as a logical equation CMMF= (MMF1+MMF2+MMF3+. . . MMFx)+MM(MF1:MFx), where MM(MF1:MFx) denotes the multiple match operation on the match flags MF1–MFx.

Figure 8:
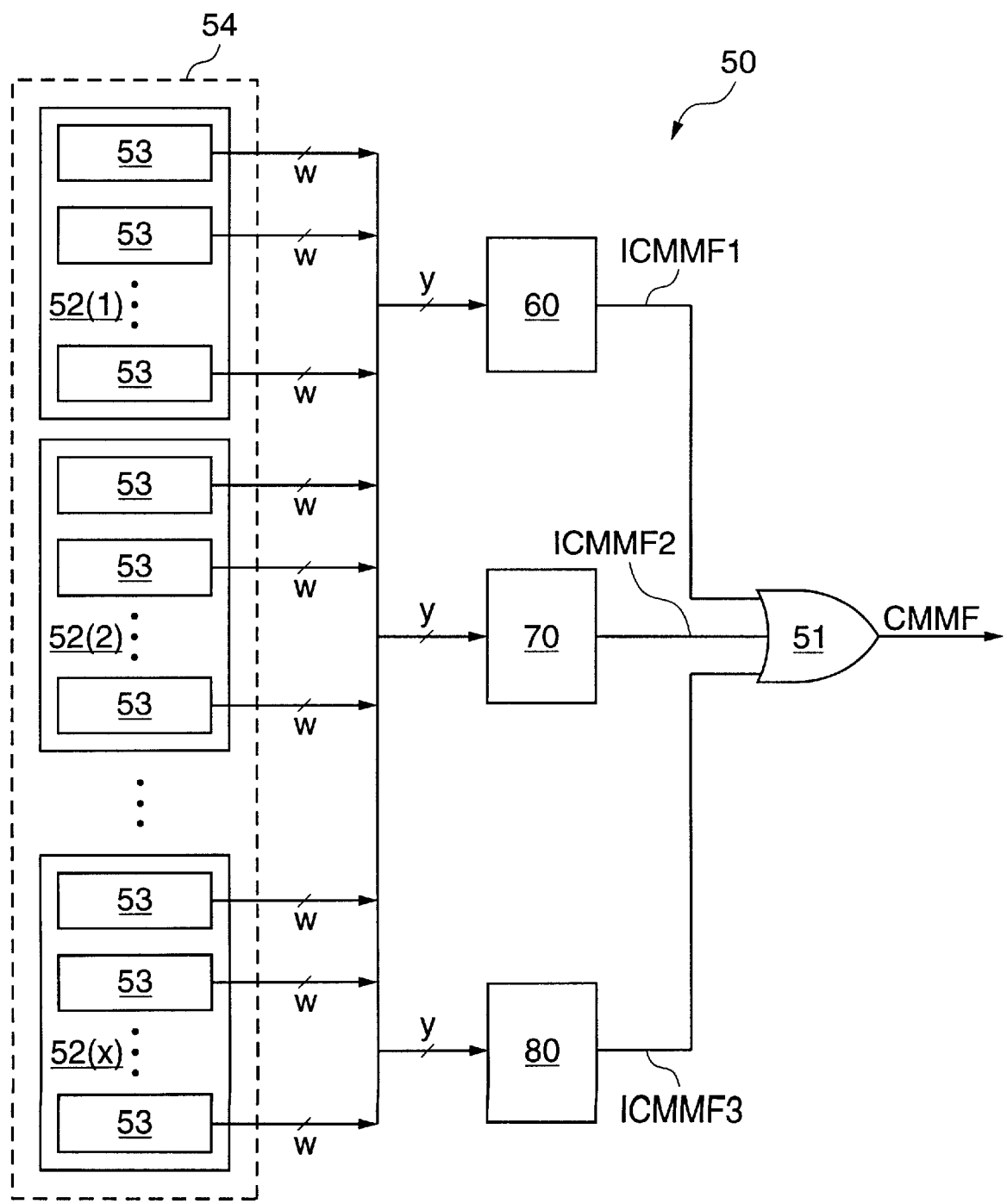
FIG. 8 is a block diagram of one embodiment of a multiple match structure implemented in accordance with the present invention using multiple match circuits of the type shown in FIGS. 5.

An alternative multiple match structure 50 is shown in FIG. 8. In this embodiment, a composite CAM array 54 includes x CAM blocks 52(1)–52(x) that are each further divided into CAM word segments 53. Each CAM word segment 53 provides w match line signals on w match lines to each of composite multiple match circuits 60, 70, and 80. Each CAM word segment 53 may have any number of match lines that may be the same number, or a different number than, that of the other CAM word segments. Each of the composite multiple match circuits 60, 70, and 80 receives all y match line signals of composite CAM array 54, where y=w times the number of CAM segments 53 in the composite array 54. Composite multiple match flag circuit 60 asserts a first intermediate composite multiple match flag ICMMF1 if it determines that there is a multiple match within one of the CAM word segments 53. Composite multiple match flag circuit 70 asserts a second intermediate composite multiple match flag ICMMF2 if it determines that there is a match condition in more that one of the CAM word segments 53 within one of the CAM blocks 52. Composite multiple match flag circuit 80 asserts a third intermediate composite multiple match flag ICMMF3 if it determines that there is a match condition in more than one of the CAM blocks 52(1)–52(x). The intermediate composite multiple match flag signals are logically combined by an OR gate 51 to generate the composite multiple match flag CMMF.

Figure 9:
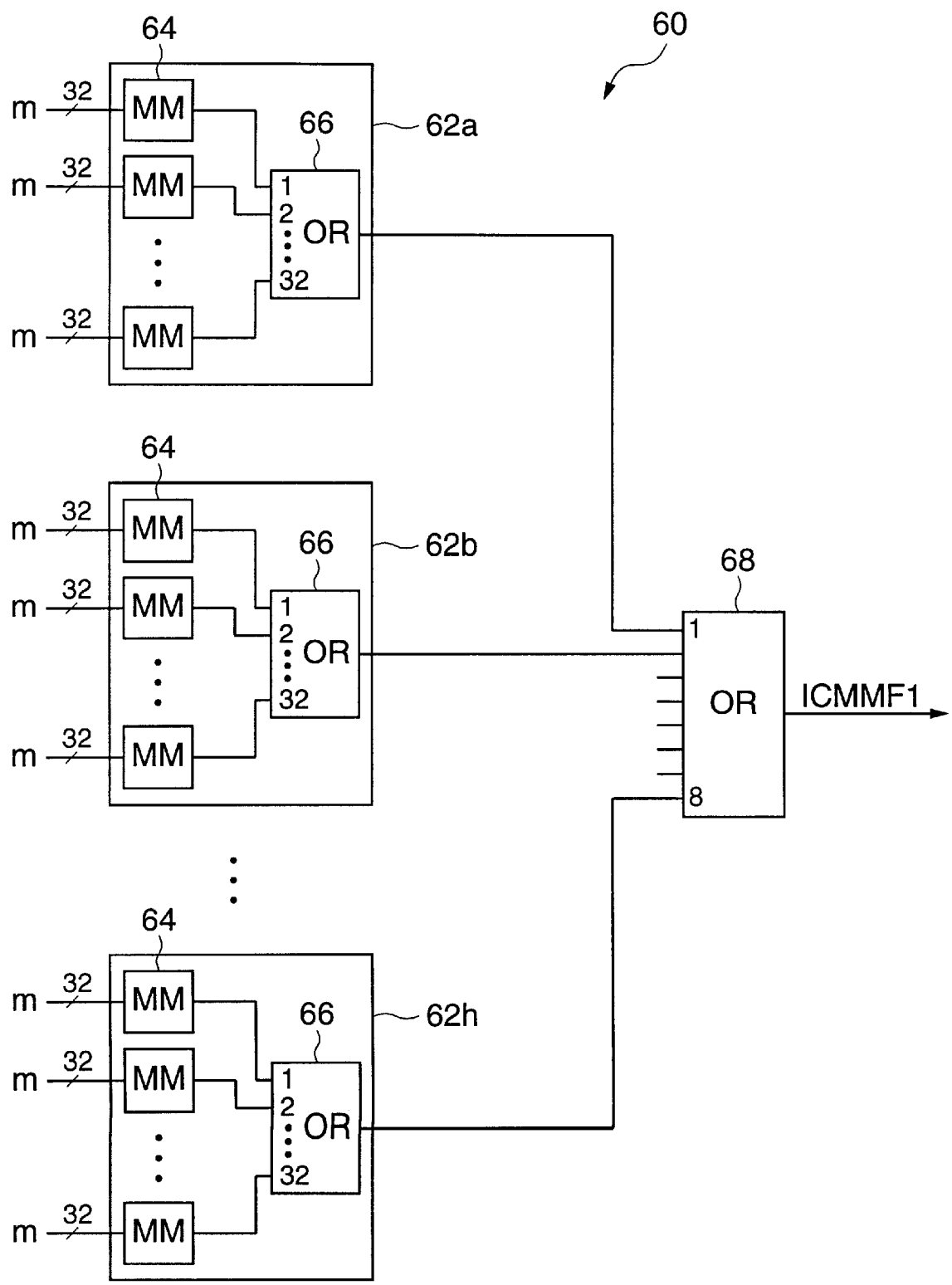
FIGS. 9–11 are block diagrams of exemplary embodiments of multiple match blocks of the multiple match structure of FIG. 8.
Figure 10:
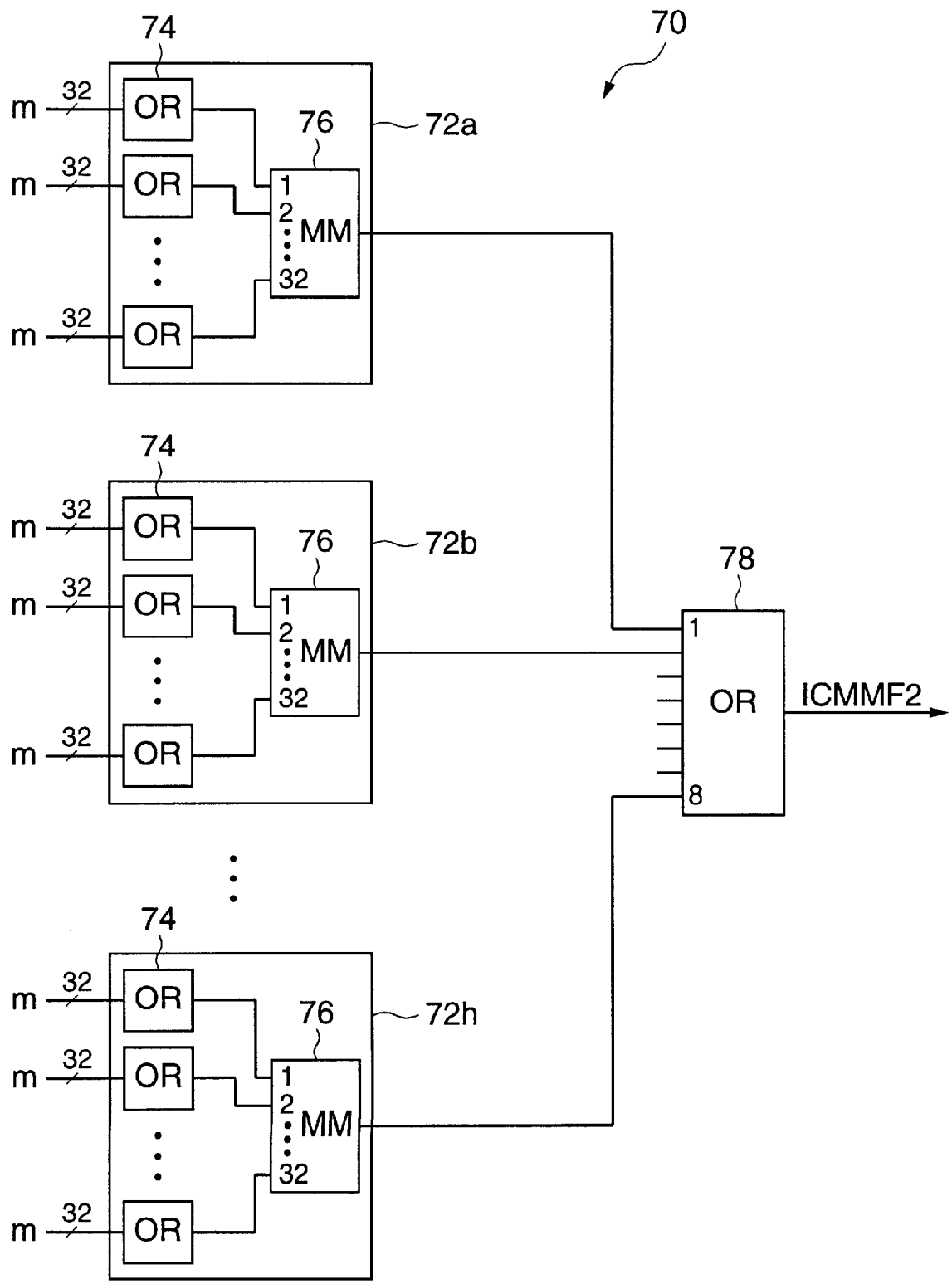
Figure 11:
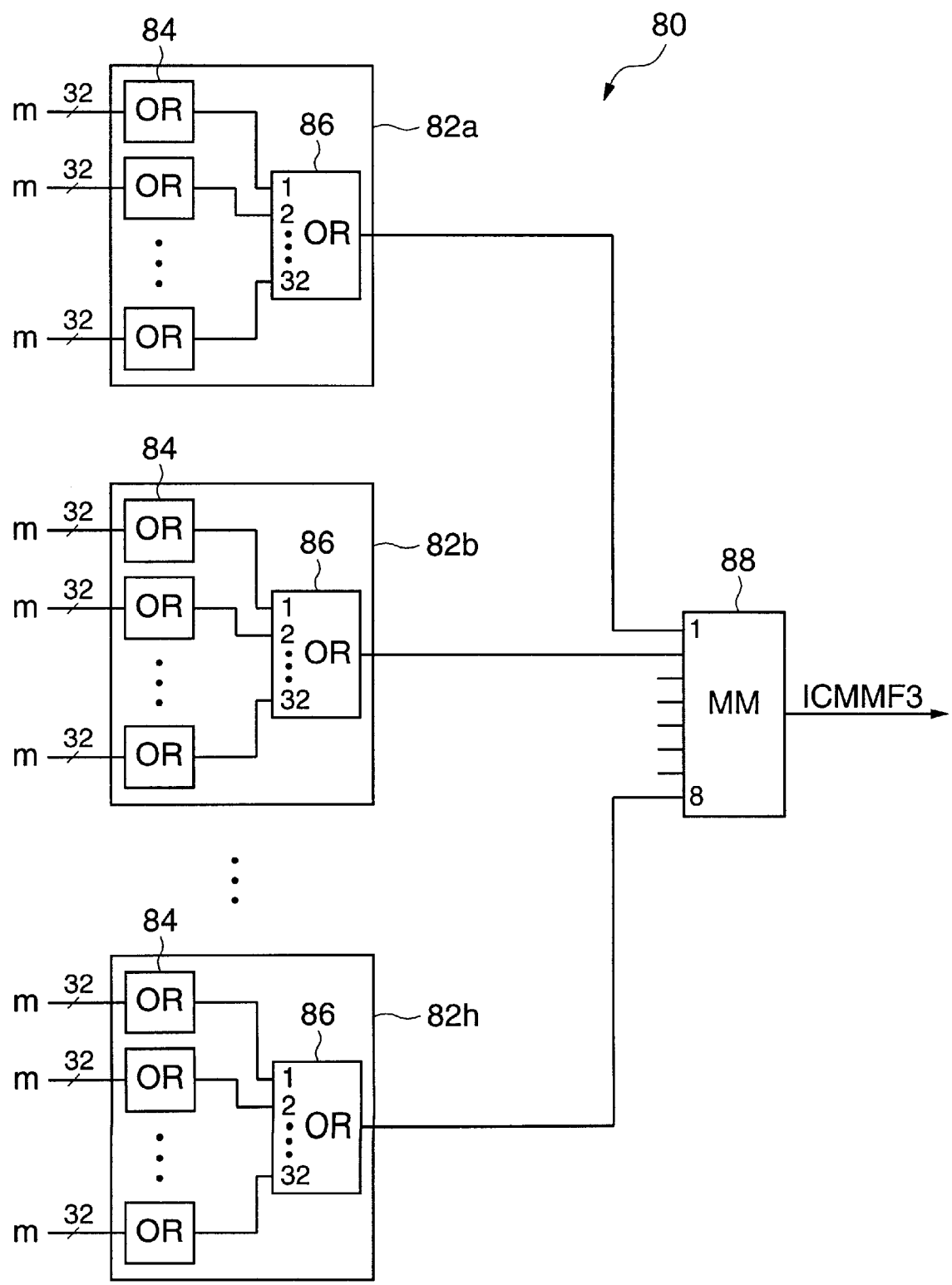

For one example, multiple match structure 50 may generate a composite multiple match flag CMMF for a composite CAM array organized as eight CAM blocks (i.e., 52(1)–52(8)) of 1 k words each, where each CAM block is further organized as 32 CAM word segments each having 32 words (i.e., w=32). The 8 k match line signals generated by the 8×1 k composite CAM array are provided to each of the composite multiple match flag circuits 60, 70, and 80. FIGS. 9–11 show exemplary embodiments of the composite multiple match circuits 60, 70, and 80, respectively, in accordance with this example.

Referring to FIG. 9, the first composite multiple match circuit 60 includes eight logic circuits 62a–62h each having an output terminal coupled to a corresponding input terminal of an 8-input OR gate 68 which, in response to signals provided by the logic circuits 62a–62h, generates the first intermediate composite multiple match flag ICMMF1. Each of logic circuits 62 includes 32 multiple match circuits 64 that are in one embodiment the multiple match circuit 30 of FIG. 5. The 32 multiple match circuits 64 within each of the logic circuits 62a–62h receive a corresponding segment of 32 match line signals m from the associated CAM array (not shown) and, in response thereto, generate 32 corresponding intermediate multiple match flags which, in turn, are logically ORed in corresponding 32-input OR gates 66 that have output terminals coupled to corresponding input terminals of an 8-input OR gate 68. Here, any asserted intermediate multiple match flag from the multiple match circuits 64 propagates through OR gates 66 and 68, thereby asserting the first intermediate composite multiple match flag ICMMF1. Since the multiple match function is performed at the first hierarchal level, i.e., within circuits 64 as opposed to circuits 66 (second hierarchal level) or circuit 68 (third hierarchal level), the first intermediate composite multiple match flag ICMMF1 is asserted if there is a multiple match within one of the segments of 32 match line signals.

Referring to FIG. 10, the second composite multiple match circuit 70 is configured to determine whether a multiple match condition exists across the 32-bit segment boundaries defined by the 32-input logic circuits 74 and within one of the 1 k-word boundaries defined by the eight 1 k-input logic circuits 72. Each of the logic circuits 72a–72h includes thirty two 32-input OR gates 74 coupled to receive respective match line signals m. Respective output terminals of the 32 OR gates 74 within each logic circuit 72 are coupled to corresponding input terminals of an associated multiple match circuit 76. The multiple match circuits 76, which are in one embodiment the multiple match circuit 30 of FIG. 5, each have an output terminal coupled to a corresponding input terminal of an 8-input OR gate 78. Here, if any of the match line signals m from more than one of the 32 logic circuits 74 within one of the eight logic circuits 72 are asserted, the corresponding multiple match circuit 76 asserts its intermediate multiple match flag which, in turn, propagates through the OR gate 78, thereby asserting the second intermediate composite multiple match flag ICMMF2. Here, since the multiple match function is performed at the second hierarchal level, i.e., within circuits 76, the second intermediate composite multiple match flag ICMMF2 is asserted if there is a match condition from more than one segment within a particular 1 k CAM block.

Referring to FIG. 11, the third composite multiple match circuit 80 is configured to determine whether a multiple match condition exists across the 1 k-word boundaries defined by 1 k-input logic circuits 82. Each of the logic circuits 82a–82h includes thirty two 32-input OR gates 84 coupled to receive respective match line signals m and having an output terminal coupled to a corresponding input terminal of an associated 32-input OR gate 86. Although shown in FIG. 11 as being implemented using 2 hierarchical levels of OR gates (i.e., OR gates 84 and 86), the logical OR function of the logic circuits 82 may in other embodiments be implemented using any suitable gate configuration. The OR gates 86 each have an output terminal coupled to a corresponding input terminal of an 8-input multiple match circuit 88 that is in one embodiment the multiple match circuit 15 of FIG. 3. Here, the multiple match circuit 88 generates the third intermediate composite match signal ICMMF3 in response to the signals provided by the OR gates 86. Thus, since the multiple match function is performed at the third hierarchal level, the third intermediate composite multiple match flag ICMMF3 is asserted if there is a match condition from more than one of the 1 k CAM blocks.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For instance, the particular logic levels of signals used in generating the various multiple match flags (e.g., intermediated multiple match flag, intermediate composite multiple match flag, and composite multiple match flag) utilized in present embodiments may be reversed or otherwise adjusted as may be desired for specific circuit implementations, in which case the final logic OR function in such implementation may be adjusted accordingly to correctly generate the appropriate multiple flags.

I claim:

1. A method for generating a multiple match flag in response to a compare operation of an associated content addressable memory (CAM) array having n words, where n>2, the method comprising:

receiving from the CAM array n match line signals having a logical state indicative of whether corresponding CAM words match a comparand word during the compare operation;

generating $k=\log_2 n$ intermediate multiple match flags, wherein each of the k intermediate multiple match flags represents a unique logical combination of the n match line signals; and logically combining the k intermediate multiple match flags to generate the multiple match flag.

2. The method of claim 1, wherein a first of the k intermediate multiple match flags is generated by:

logically ORing the first n/2 match line signals to generate a first signal;

logically ORing the second n/2 match line signals to generate a second signal; and logically ANDing the first and second signals to generate the first intermediate multiple match flag.

3. The method of claim 1, wherein a second of the k intermediate multiple match flags is generated by:

logically ORing the first n/4 match line signals to generate a first signal;

logically ORing the second n/4 match line signals to generate a second signal;

logically ANDing the first and second signals to generate a first intermediate signal;

logically ORing the third n/4 match line signals to generate a third signal;

logically ORing the fourth n/4 match line signals to generate a fourth signal;

logically ANDing the third and fourth signals to generate a second intermediate signal; and logically ORing the first and second intermediate signals to generate the second intermediate multiple match flag.

4. The method of claim 1, wherein a final of the k intermediate multiple match flags is generated by:

logically ANDing pairs of the match line signals to generate n/2 signals; and logically ANDing the n/2 signals to generate the $k^{th}$ intermediate multiple match flag.

5. The method of claim 1, wherein the k intermediate multiple match flags are logically ORed to generate the multiple match flag.

6. The method of claim 1, wherein signal lines corresponding to the intermediate multiple match flags are precharged to a supply voltage.

7. The method of claim 1, wherein a first intermediate multiple match flags is generated by:
   dividing the n match line signals into first and second groups associated with the first intermediate multiple match flag, the first group including a first n/2 match line signals and the second group including the second n/2 match line signals;
   logically ORing the match line signals within the first group to generate a first signal;
   logically ORing the match line signals within the second group to generate a second signal; and
   logically ANDing the first and second signals to generate the first intermediate multiple match flag.

8. The method of claim 7, wherein a subsequent intermediate multiple match flag is generated by:
   dividing the match line signals within each group associated with the generation of a previous intermediate multiple match flag into corresponding first and second halves;
   logically ORing the match line signals within each of the first and second halves to generate respective OR output signals;
   logically ANDing pairs of the OR output signals to generate respective AND output signals; and
   logically ORing the AND output signals to generate the subsequent intermediate multiple match flag.

9. A method for generating a multiple match flag in response to a compare operation of an associated content addressable memory (CAM) array having n words, where n>2, the method comprising:
   receiving from the CAM array n match line signals having a logical state indicative of whether corresponding CAM words match a comparand word during the compare operation;
   generating in each of $k=\log_2 n$ iterations a corresponding intermediate multiple match flag, wherein each of the k intermediate multiple match flags represents a unique logical combination of the n match line signals; and
   logically combining the k intermediate multiple match flags to generate the multiple match flag.

10. The method of claim 9, wherein each of the $k=\log_2 n$ iterations or match logic circuits divides the n match line signals into m groups of n/m match line signals.

11. The method of claim 9, where in each of the k iterations, each of the groups of match line signals defined in a previous iteration is divided into halves, and the corresponding intermediate multiple match flag is asserted if, for any of the groups defined by the previous iteration, there is at least one match condition within both of the halves defined in the present iteration.

12. A multiple match circuit which generates a multiple match flag in response to a compare operation of an associated content addressable memory (CAM) array having n>2 words, the circuit comprising:
   $k=\log_2 n$ intermediate multiple match circuits each coupled to receive from the CAM array n match line signals having a logical state indicative of whether corresponding CAM words match a comparand word during the compare operation, wherein each intermediate multiple match circuit has an output terminal to provide a corresponding intermediate multiple match flag representing a unique logical combination of the n match line signals; and
   a logic circuit coupled to receive the intermediate multiple match flags and to provide the multiple match flag at an output terminal thereof.

13. The circuit of claim 12, wherein a first of the k intermediate multiple match circuits comprises:
   means for logically ORing the first n/2 match line signals to generate a first signal;
   means for logically ORing the second n/2 match line signals to generate a second signal; and
   means for logically ANDing the first and second signals to generate the first intermediate multiple match flag.

14. The circuit of claim 12, wherein a second of the k intermediate multiple match circuits comprises:
   means for logically ORing the first n/4 match line signals to generate a first signal;
   means for logically ORing the second n/4 match line signals to generate a second signal;
   means for logically ANDing the first and second signals to generate a first intermediate signal;
   means for logically ORing the third n/4 match line signals to generate a third signal;
   means for logically ORing the fourth n/4 match line signals to generate a fourth signal;
   means for logically ANDing the third and fourth signals to generate a second intermediate signal; and
   means for logically ORing the first and second intermediate signals to generate the second intermediate multiple match flag.

15. The circuit of claim 12, wherein a final of the k intermediate multiple match circuits comprises:
   means for logically ANDing pairs of the match line signals to generate n/2 signals; and
   means for logically ANDing the n/2 signals to generate the $k^{th}$ intermediate multiple match flag.

16. A method for generating a composite multiple match flag in response to a compare operation for a plurality of content addressable memory (CAM) blocks, the method comprising:
   generating for each CAM block a match flag indicative of a match condition during the compare operation;
   generating for each CAM block a multiple match flag indicative of a multiple match condition during the compare operation;
   logically combining the match flags to generate a first intermediate multiple match flag indicative of whether two or more of the match flags indicate a match condition;
   logically combining the multiple match flags to generate a second intermediate multiple match flag indicative of whether at least one of the multiple match flags indicates a multiple match condition; and
   logically combining the first and second intermediate multiple match flags to generate the composite multiple match flag.

17. The method of claim 16, wherein the match flags are logically combined in a multiple match circuit to generate the first intermediate multiple match flag.

18. The method of claim 16, wherein the multiple match flags are combined in an OR gate to generate the second intermediate multiple match flag.

19. The method of claim 16, wherein the first and second intermediate multiple match flags are logically combined in an OR gate.

20. The method of claim 16, wherein generating the multiple match flag for each CAM block further comprises:
   receiving n match line signals having a logical state indicative of whether corresponding words in the CAM block match a comparand word during the compare operation;

generating k=log$_2$n intermediate multiple match flags, wherein each of the k intermediate multiple match flags represents a unique logical combination of the n match line signals; and logically combining the k intermediate multiple match flags to generate the first intermediate multiple match flag.

21. A composite multiple match structure which generates a composite multiple match flag in response to a compare operation of a plurality of content addressable memory (CAM) blocks, the circuit comprising:

a plurality of match circuits, each of which generates for an associated one of the CAM blocks a match flag indicative of a match condition during the compare operation;

a plurality of multiple match circuits, each of which generates for an associated one of the CAM blocks a multiple match flag indicative of a multiple match condition during the compare operation;

a first logic circuit having a plurality of input terminals coupled to receive the multiple match flags, and having an output terminal;

a block multiple match circuit having a plurality of input terminals coupled to receive the match flags, and having an output terminal; and a second logic circuit having first and second input terminals coupled to the respective output terminals of the first logic circuit and the block multiple match circuit and having an output terminal to provide the composite multiple match flag.

22. The structure of claim 21, wherein the first logic circuit comprises an OR gate.

23. The structure of claim 21, wherein the second logic circuit comprises an OR gate.

24. The structure of claim 21, wherein each of the plurality of multiple match circuits comprises:

k=log$_2$n intermediate multiple match circuits each coupled to receive from the associated CAM block n match line signals having a logical state indicative of whether corresponding words in the CAM block match a comparand word during the compare operation, wherein each intermediate multiple match circuit has an output terminal to provide a corresponding intermediate multiple match flag representing a unique logical combination of the n match line signals; and a third logic circuit coupled to receive the intermediate multiple match flags and to provide the multiple match flag at an output terminal thereof.

25. The structure of claim 21, wherein the block multiple match circuit comprises:

k=log$_2$n intermediate multiple match circuits each coupled to receive the match flags and having an output terminal to provide a corresponding intermediate composite multiple match flag representing a unique logical combination of the match flags; and a third logic circuit coupled to receive the intermediate multiple match flags and to provide the multiple match flag at an output terminal thereof.

26. A composite multiple match structure which generates a composite multiple match flag in response to a compare operation of a plurality of content address memory (CAM) blocks each including a number of CAM word segments, comprising:

a first composite multiple match circuit coupled to receive a number of match line signals from each of the plurality of CAM blocks, the match line signals having a logical state indicative of a match condition between corresponding words in the CAM word segment and a comparand word during the compare operation, the first composite multiple match circuit to assert a first intermediate composite multiple match flag when there are two or more match conditions within one of the CAM word segments;

a second composite multiple match circuit coupled to receive the number of match line signals from each of the plurality of CAM blocks, the second composite multiple match circuit to assert a second intermediate composite multiple match flag when there are two or more match conditions within one of the CAM blocks;

a third composite multiple match circuit coupled to receive the number of match line signals from each of the plurality of CAM blocks, the third composite multiple match circuit to assert a third intermediate composite multiple match flag when there is a match condition in two or more CAM word segments of different CAM blocks; and a logic circuit having first, second, and third input terminals to receive the respective first, second, and third intermediate composite multiple match flags, and having an output terminal to provide the composite multiple match flag.

27. The structure of claim 26, wherein the first composite multiple match circuit comprises:

a plurality of multiple match circuits each coupled to receive the match line signals from a corresponding CAM word segment;

a plurality of first logic circuits each having input terminals coupled to respective output terminals of the multiple match circuits of a corresponding CAM block; and a second logic circuit having a plurality of input terminals coupled to respective output terminals of the plurality of first logic circuits.

28. The structure of claim 27, wherein at least one of the multiple match circuit comprises:

k=log$_2$n intermediate multiple match circuits each coupled to receive n match line signals having a logical state indicative of whether corresponding words match a comparand word during the compare operation, wherein each intermediate multiple match circuit has an output terminal to provide a corresponding intermediate multiple match flag representing a unique logical combination of the n match line signals; and a third logic circuit coupled to receive the intermediate multiple match flags and to provide the first intermediate composite multiple match flag at an output terminal thereof.

29. The structure of claim 28, wherein the first, second, and third logic circuits comprise OR gates.

30. The structure of claim 26, wherein the second composite multiple match circuit comprises:

a plurality of first logic circuits each coupled to receive the match line signals from a corresponding CAM word segment;

a plurality of multiple match circuits each having input terminals coupled to respective output terminals of the first logic circuits of a corresponding CAM block; and a second logic circuit having a plurality of input terminals coupled to respective output terminals of the plurality of multiple match circuits.

31. The structure of claim 30, wherein at least one of the multiple match circuits comprises:

k=log$_2$n intermediate multiple match circuits each coupled to receive n match signals from the respective output terminals of the first logic circuits of the corresponding CAM block, wherein each intermediate multiple match circuit has an output terminal to provide a corresponding intermediate multiple match flag representing a unique logical combination of the n match signals, where n is less than the number of match line signals from a CAM block; and a third logic circuit coupled to receive the intermediate multiple match flags and to provide the second intermediate composite multiple match flag at an output terminal thereof.

32. The structure of claim 30, wherein the first, second, and third logic circuits comprise OR gates.

33. The structure of claim 26, wherein the third composite multiple match circuit comprises:

a plurality of first logic circuits each coupled to receive the match line signals from a corresponding CAM block; and a multiple match circuit having a plurality of input terminals coupled to respective output terminals of the plurality of first logic circuits.

34. The structure of claim 33, wherein the multiple match circuit comprises:

k=log$_2$n intermediate multiple match circuits each coupled to receive n match signals from the respective output terminals of the plurality of first logic circuits, wherein each intermediate multiple match circuit has an output terminal to provide a corresponding intermediate multiple match flag representing a unique logical combination of the n match signals; and a second logic circuit coupled to receive the intermediate multiple match flags and to provide the third intermediate composite multiple match flag at an output terminal thereof.

35. The structure of claim 33, wherein the first and second logic circuits comprise OR gates.

\* \* \* \* \*